US008880979B2

(12) United States Patent
Campardo et al.

(10) Patent No.: US 8,880,979 B2
(45) Date of Patent: Nov. 4, 2014

(54) SECONDARY MEMORY TO STORE A VARYING AMOUNT OF OVERHEAD INFORMATION

(71) Applicant: Micron Technology, Inc., Boise, ID (US)

(72) Inventors: Giovanni Campardo, Bergamo (IT); Stefano Corno, Agrate Brianza (IT); Gian Pietro Vanalli, S. Bartolomeo (IT); Manuela Scognamiglio, Molgora (IT); Danilo Caraccio, Buonalbergo (IT); Federico Tiziani, Muggio' (IT); Massimiliano Magni, Lomagna (IT); Andrea Ghilardelli, Cinisello Balsamo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/907,669

(22) Filed: May 31, 2013

(65) Prior Publication Data
US 2013/0268825 A1 Oct. 10, 2013

Related U.S. Application Data

(63) Continuation of application No. 12/346,015, filed on Dec. 30, 2008, now Pat. No. 8,458,562.

(51) Int. Cl.
G11C 29/42 (2006.01)
G06F 11/10 (2006.01)
G11C 29/54 (2006.01)
G11C 29/04 (2006.01)

(52) U.S. Cl.
CPC ........ *G11C 29/42* (2013.01); *G11C 2029/0411* (2013.01); *G06F 11/1048* (2013.01)
USPC .......................................... 714/763; 714/718

(58) Field of Classification Search
CPC ............ G06F 11/1076; G06F 11/1008; G06F 11/1004; G06F 11/1048; G11C 2029/0411; G11C 29/42; H04L 1/0057; H04L 1/0045; H03M 13/116
See application file for complete search history.

(56) References Cited

U.S. PATENT DOCUMENTS

| 5,303,197 | A | 4/1994 | Miyashita et al. |
| 5,546,402 | A | 8/1996 | Niijima et al. |
| 5,822,581 | A * | 10/1998 | Christeson ........................ 713/1 |
| 6,557,138 | B1 * | 4/2003 | Modelli ........................ 714/753 |
| 7,487,428 | B2 | 2/2009 | Co et al. |
| 7,523,274 | B2 | 4/2009 | Ryu et al. |

(Continued)

OTHER PUBLICATIONS

MX25L1635D Datasheet, Macronix International Co., Ltd., Rev. 1.3, 50 pages, Jul. 8, 2008.

(Continued)

*Primary Examiner* — Ajay Bhatia
*Assistant Examiner* — Dipakkumar Gandhi
(74) *Attorney, Agent, or Firm* — Knobbe, Martens, Olson & Bear LLP

(57) ABSTRACT

A method and system are disclosed in which a first non-volatile memory includes blocks that store data, and a second memory that stores overhead information related to the blocks storing the data. The amount of the second memory storing the overhead information related to the at least one block of the plurality of blocks is varied.

23 Claims, 6 Drawing Sheets

(56) References Cited

U.S. PATENT DOCUMENTS

| | | |
|---|---|---|
| 7,643,334 B1 | 1/2010 | Lee et al. |
| 8,131,912 B2 | 3/2012 | Ozawa et al. |
| 8,458,562 B1 * | 6/2013 | Campardo et al. ............ 714/763 |
| 8,473,815 B2 | 6/2013 | Chung et al. |
| 2005/0281113 A1 | 12/2005 | Yada et al. |
| 2007/0028150 A1 * | 2/2007 | Shepard ......................... 714/48 |
| 2007/0150644 A1 | 6/2007 | Pinto et al. |
| 2007/0174753 A1 * | 7/2007 | Sonnekalb ................... 714/755 |
| 2008/0266962 A1 * | 10/2008 | Jeon et al. ................ 365/185.12 |
| 2009/0077429 A1 | 3/2009 | Yim et al. |
| 2009/0319864 A1 * | 12/2009 | Shrader ......................... 714/758 |
| 2010/0037001 A1 | 2/2010 | Langlois et al. |

OTHER PUBLICATIONS

W25Q80, W25Q16, W25Q32 Winbond Spiflash, Preliminary—Revision B, 61 pages, Sep. 26, 2007.

Serial Quad I/O (SQI) Flash Memory SST26VF016/SST26VF032, Silicon Storage Technology, Inc., 34 pages, Apr. 2008.

\* cited by examiner

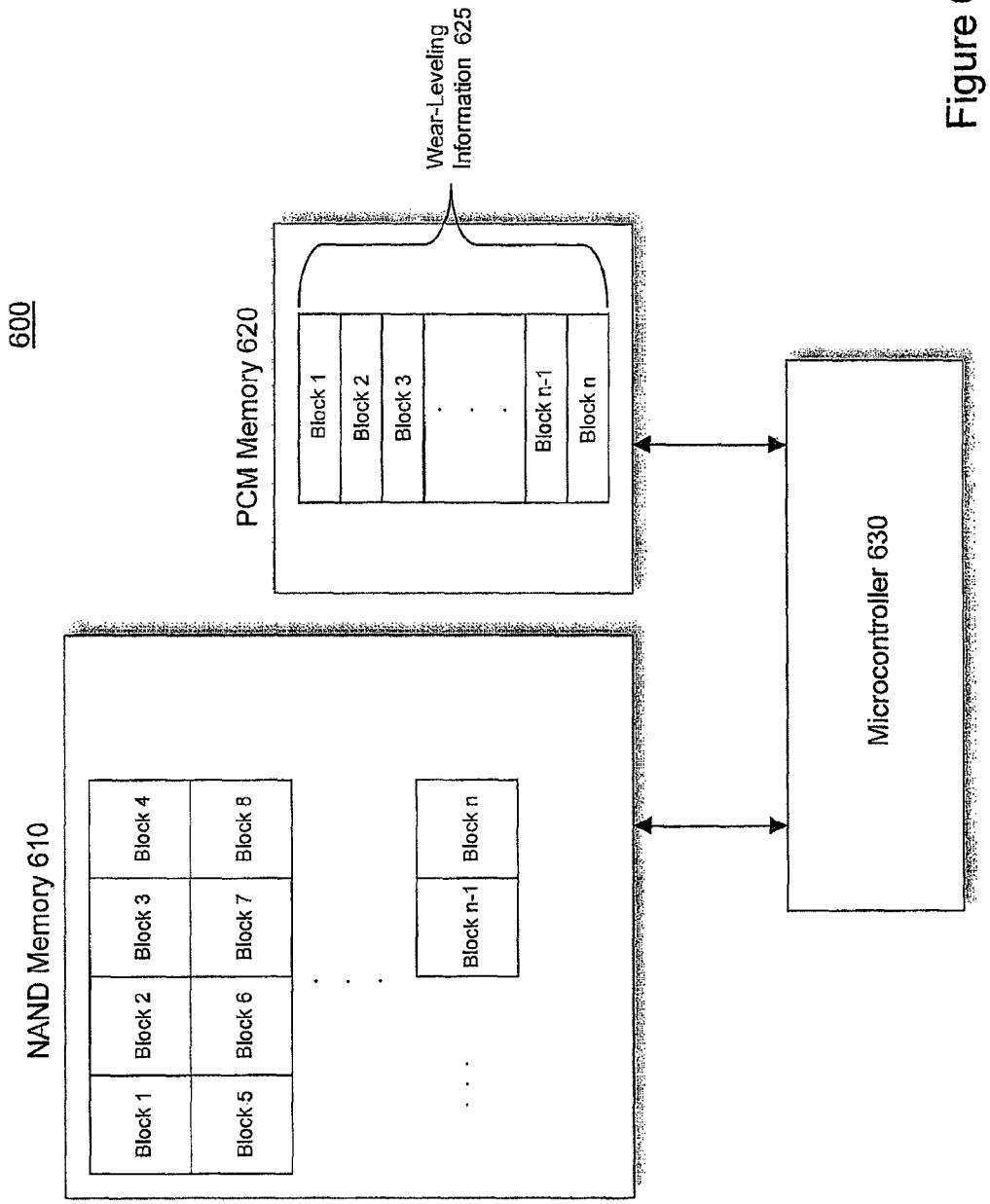

SECONDARY MEMORY TO STORE A VARYING AMOUNT OF OVERHEAD INFORMATION

CROSS-REFERENCE TO RELATED APPLICATIONS

This application is a continuation of U.S. patent application Ser. No. 12/346,015, filed Dec. 30, 2008 and incorporated in its entirety by reference herein.

BACKGROUND

1. Field of the Application

Subject matter disclosed herein may relate to non-volatile memory, and may relate in particular to improving the reliability or extending the useful life of a non-volatile memory device, for example.

2. Description of the Related Art

Non-volatile memory devices, including Flash memory devices, may be found in a wide range of electronic devices. In particular, Flash memory devices may be used in computers, digital cameras, cellular telephones, personal digital assistants, etc. Flash memories may be embedded in the devices, or may be incorporated into portable solid-state storage devices. As Flash memories continue to increase in storage capacity, and as storage cell geometries decrease, issues related to error correction/detection and device longevity may become more prominent.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 6 is a block diagram of an example embodiment of a secondary memory containing wear-leveling information related to blocks of storage locations in a primary memory.

DETAILED DESCRIPTION

Figure 1:
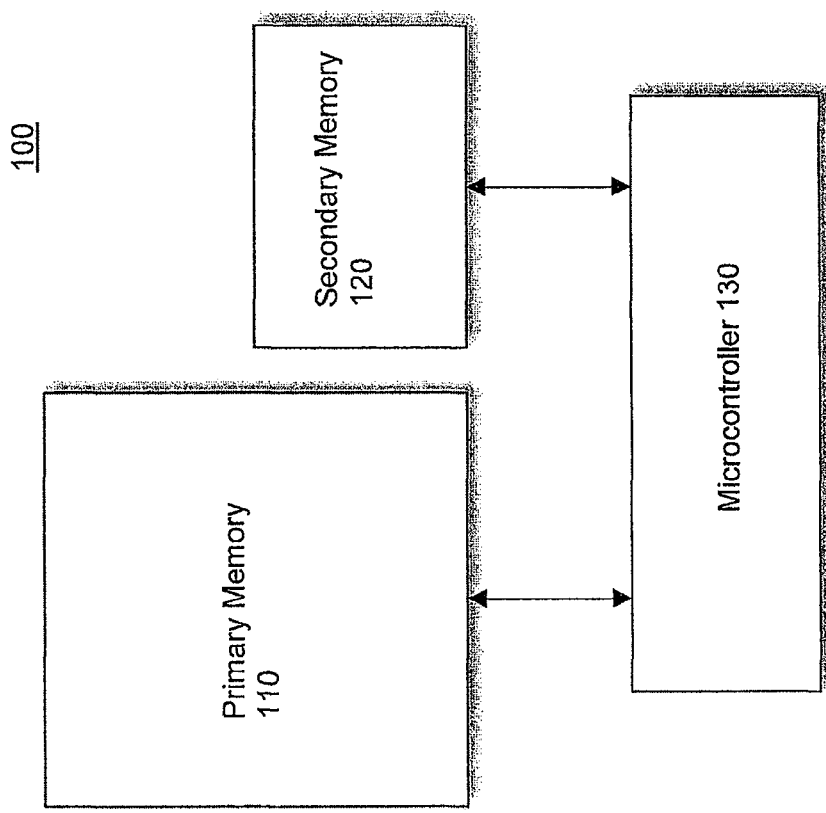
FIG. 1 is a block diagram of an example embodiment of a solid-state storage device.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

Some portions of the detailed description which follow are presented in terms of algorithms or symbolic representations of operations on data bits or binary digital signals stored within a computing platform memory, such as a computer memory. These algorithmic descriptions or representations are examples of techniques used by those of ordinary skill in the data processing arts to convey the substance of their work to others skilled in the art. An algorithm here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform. Further, unless specifically stated otherwise, processes described herein, with reference to flow diagrams or otherwise, may also be executed and/or controlled, in whole or in part, by such a computing platform.

As discussed above, as non-volatile memories, such as Flash memories, increase in storage capacity and as storage cell geometries decrease, issues related to error correction/detection and device longevity may become more prominent. As used herein, the term "non-volatile memory" may relate to a memory that does not need power to maintain information stored in the memory. Non-volatile memories may be utilized in a very wide range of electronic device types, including, but not limited to, digital cameras, cellular telephones, personal digital assistants, portable navigation devices, portable music players, notebook computers, desktop computers, etc., to name but a few examples. Non-volatile memories may also be employed, for example, in solid-state storage devices such as memory sticks, Universal Serial Bus (USB) flash drives, memory cards, etc., again, to name but a few examples.

Flash memory is a popular type of non-volatile memory that may be characterized at least in part by the ability to be electrically erasable and programmable. Erase operations may occur on a per-block basis, where a block may comprise a plurality of storage locations. For merely one example, a block may comprise 16 kB of storage. For some flash memories, a block may comprise a number of pages. Continuing the current example, a flash memory with a block size of 16 kB may comprise 32 pages with 512 bytes per page. Flash memories may also comprise several bytes of storage space per page that may be utilized for error detection and correction information, such as, for example, a checksum. Of course, these are merely example characteristics of a flash memory, and the scope of claimed subject matter is not limited in these respects.

Flash memories may also be characterized, at least in part, by the gradual deterioration of storage cells as they undergo erase operations, resulting in an inability to correctly and reliably store data after a number of erase operations. Because erase operations may be performed on a per-block basis, blocks that are erased most often are most likely to become unreliable first. The number of erase operations that a block may undergo before experiencing reliability issues may vary widely, depending on any of a number of possible factors. However, for one example flash memory, the number of write-erase cycles that may be performed before a block begins to experience reliability issues may be about 100,000, although of course this number is merely an example.

As the densities of flash memories increase, the number of errors in reading and writing data may increase, and data retention errors may also increase. To accommodate the possibility of increased errors, more powerful error correction and detection procedures may be utilized, perhaps requiring an increased number of bytes per page to be set aside in the flash memory for error detection and correction checksum information, resulting in increased overhead. Further, as the blocks age as they undergo erase operations over time, the storage locations utilized by the error detection and correction information may become unreliable.

FIG. 1 is a block diagram of an example information storage system 100 comprising a primary memory component 110 and a secondary memory component 120. The two memory components for this example are coupled to a microcontroller 130, which may manage accesses to primary memory 110 from external components or devices. Microcontroller 130 for this example embodiment is coupled to primary memory 110 and secondary memory 130 by one or more address lines, control lines, and data lines. For one embodiment, such as that depicted in FIG. 1, microcontroller 130 may communicate with primary memory 110 and secondary memory 130 via separate sets of address, control, and data lines, although the scope of claimed subject matter is not limited in this respect. For one or more embodiments, primary memory 110 may comprise a flash memory. For an embodiment, primary memory 110 may comprise a NAND flash memory device, although the scope of claimed subject matter is not limited in this respect. For example, other embodiments may incorporate a NOR flash memory. Also for one or more embodiments, secondary memory 120 may comprise a phase-change memory (PCM) component, although the scope of claimed subject matter is not limited in this respect.

The term "PCM memory" as used herein relates to a type of non-volatile memory that is based on the characteristics of chalcogenide glass that can be switched between crystalline and amorphous states with an application of heat. PCM memory devices may also be referred to as PRAM devices. PCM memory differs from flash memory in a number of ways. Once difference is that with PCM memory single bits may be changed to either 1 or 0 without needing to first erase a block of cells. Also, while a small amount of degradation may occur over time, the amount of degradation is generally considered to be several orders of magnitude less than that of flash memories.

For an embodiment, secondary memory 120 may contain error detection and correction information related to blocks of information stored in primary memory 110. In providing a separate memory device for storing error detection and correction information, it may be possible to devote more bits of information to error detection and correction schemes, thereby providing increased ability to detect and correct errors. Further, by locating the error detection and correction information on secondary memory 120, the error detection and correction information may not be subject to the more easily deteriorating primary memory. Further, the increased ability to detect and correct errors may provide for a greater number of erase cycles in primary memory 110 before the number of errors grows too large to be adequately handled by the increased ability to detect and correct errors made possible by the larger number of bits dedicated to the task.

For an embodiment, secondary memory 120 may be smaller than primary memory 110. The size of secondary memory 120 may be selected according to the level of error correction and detection desired, for example. Also, although example embodiments described herein utilize PCM memory for secondary memory 120, the scope of claimed subject matter is not limited in this respect.

For one or more embodiments, error detection and correction operations may be performed by microcontroller 130. Microcontroller 130, for one or more embodiments, may comprise any of a range of device types capable of executing instructions. Also, for the example embodiment depicted in FIG. 1, microcontroller 130 may provide an interface to other devices or components within an electronic device. For example, if system 100 is implemented in a notebook computer, system logic components of the computer may communicate with primary memory 110 through microcontroller 130. Similarly, if system 100 comprises a USB flash drive, microcontroller 130 may be coupled to an external connector, so that if the flash drive is inserted into a host computing platform or other device, microcontroller 130 becomes connected to that host computing platform, and the host computing platform may access primary memory 110 through microcontroller 130. In addition to managing access to primary memory 110 and performing error detection and correction operations, microcontroller 130 may also perform wear-leveling operations, as discussed below. For some embodiments, information utilized in wear-leveling operations may be stored in a secondary memory, as also discussed below.

Further, information storage system 100 may comprise any of a wide range of device types that utilize non-volatile memory. For example, information storage system 100 may comprise a solid-state storage device such as a USB flash drive. Information storage system 100 may be embedded in a digital camera or in a notebook computer, to name a couple of additional examples. Other possible device types may include, but are not limited to, cellular phones, personal digital assistants, desktop computers, memory cards, memory sticks, etc. However, these are merely examples of device types that may incorporate a system such as information storage system 100, and the scope of claimed subject matter is not limited in this respect.

Figure 2:
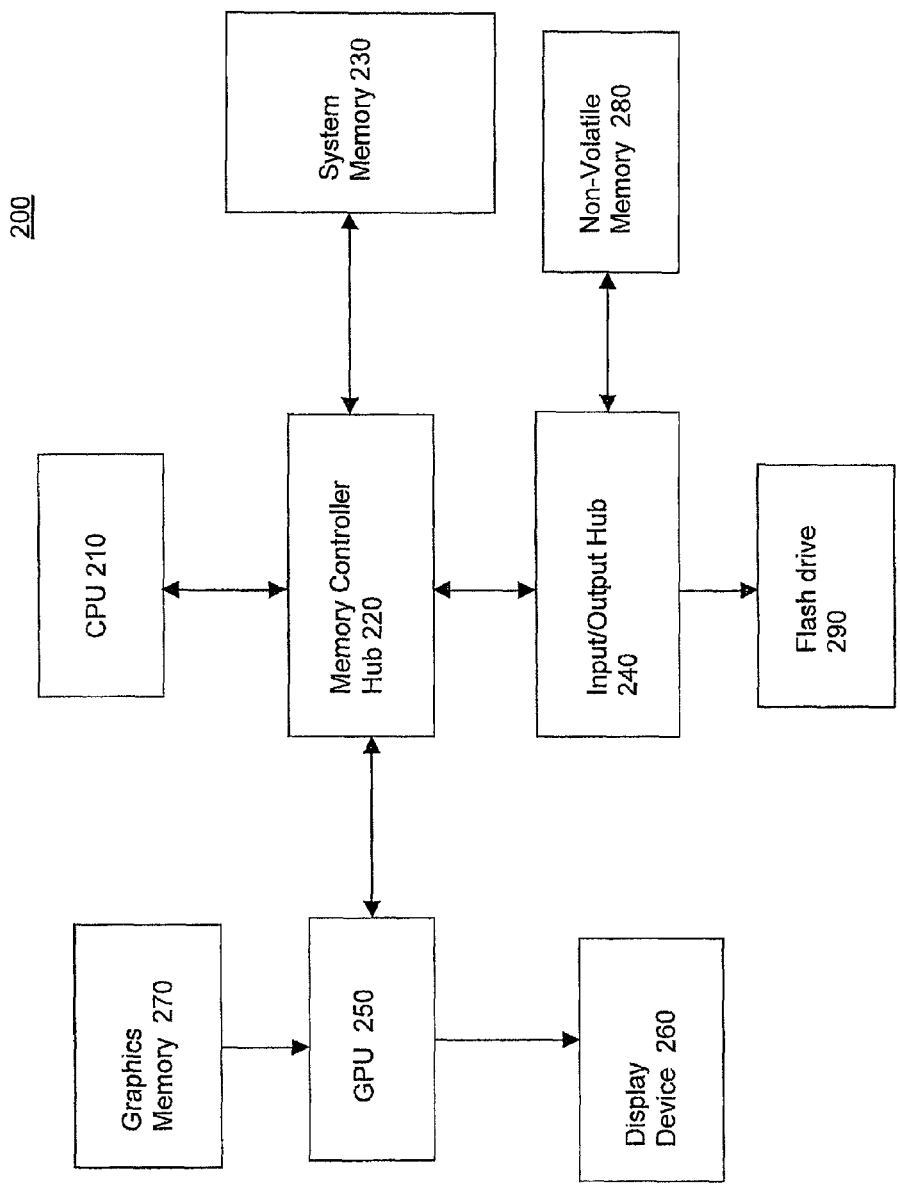
FIG. 2 is a block diagram depicting an example embodiment of a computing platform.

FIG. 2 is a block diagram of an example embodiment of a computing platform 200. The example of FIG. 2 depicts a couple of different possibilities for embodiments of information storage systems such as that described above in connection with FIG. 1. For the present example, Flash drive 290 and non-volatile memory 280 may comprise information storage systems in accordance with embodiments described herein, for example as described above for storage system 100. Computing platform 200 merely represents one possible computing platform configuration, and the scope of claimed subject matter is not limited in this respect. Computing platform 200 may comprise a central processing unit (CPU) 210 and a memory controller hub 220 coupled to CPU 210. Memory controller hub 220 is further coupled to a system memory 230, to a graphics processing unit (GPU) 250, and to an input/output hub 240. GPU 250 is further coupled to a display device 260, which may comprise a CRT display, a flat panel LCD display, or other type of display device. Also coupled to GPU 250 is a graphics memory 270. For this example embodiment, graphics memory 270 may be coupled to GPU 250 via a parallel data interface or interconnect, and input/output hub 240 may be coupled to memory controller hub 220 via a serial data interface or interconnect.

Further, for the example embodiment depicted in FIG. 2, input/output hub 240 may be coupled to non-volatile memory 280, and may further be coupled to Flash drive 290, which, for the embodiment depicted in FIG. 2, may comprise a USB Flash drive inserted into a USB port in system 200 (not shown). As mentioned above, Flash drive 290 may comprise an information storage system in accordance with the example embodiment depicted in FIG. 1. Also for an embodiment, non-volatile memory 280 may also comprise an information storage system in accordance with the example embodiment depicted in FIG. 1. System memory 230 may, for an embodiment, have stored thereon instructions, that, if executed by CPU 210 may enable the computing platform to perform at least in part error detection and correction operations related to non-volatile memory 280, although the scope of claimed subject matter is not limited in this respect. Also, Flash drive 280 may incorporate a microcontroller that may be enabled to perform error detection and correction operations, for one or more embodiments.

The scope of claimed subject matter is not limited to any particular error detection technique, nor is it limited to any particular error correction technique. Any of a wide range of error detection and correction techniques may be utilized in one or more embodiments. "Error detection" may relate to the ability to detect the presence of errors caused by noise or other signal integrity issues during transmission from a transmitter to a receiver, and may also relate to the detection of data retention errors, that is, errors that occur after the data is received at the receiving device. "Error correction" may relate to the ability to reconstruct the original, error free data given the corrupted data and its associated error correction code. As mentioned previously, for one or more embodiments, data may be stored in a primary non-volatile memory component, and the error correction information associated with the data may be stored in a secondary non-volatile memory. The discussion below in connection with FIGS. 3 and 4 describe some example embodiments for storing error correction information in a secondary memory component.

The term "computing platform" as used herein refers to a system or a device that includes the ability to process or store data in the form of signals. Thus, a computing platform, in this context, may comprise hardware, software, firmware or any combination thereof. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. Computing platform 200 is merely one example of a computing platform, and the scope of claimed subject matter is not limited in this respect.

Figure 3:
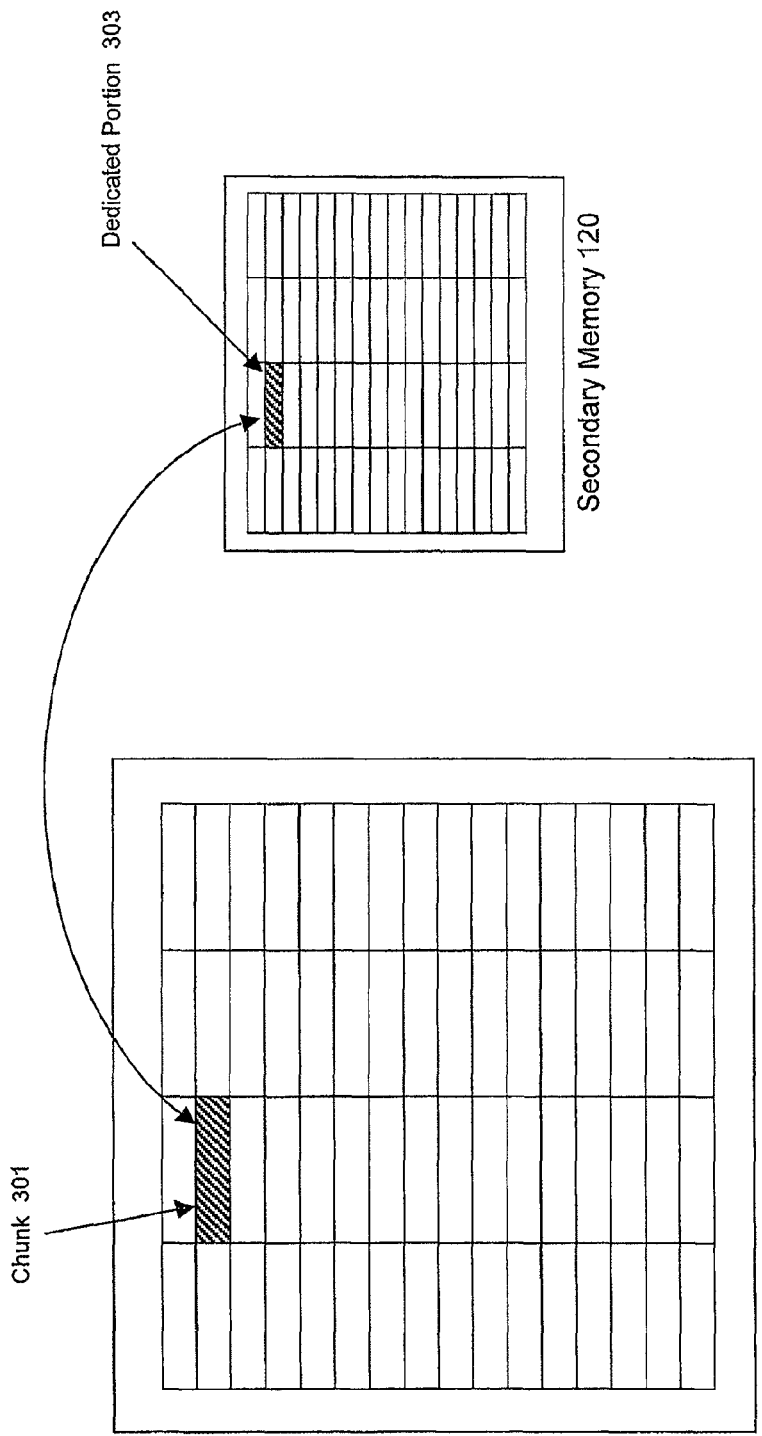
FIG. 3 is a diagram depicting an example embodiment of a secondary memory containing error correction information related to information stored in a primary non-volatile memory.

FIG. 3 is a diagram depicting an array of storage locations for primary memory 110 and secondary memory 120. For one or more embodiments, a dedication portion 303 of secondary memory 120 may be associated with a chunk 301 of primary memory 110. For an embodiment, there may be a one-to-one relationship between chunk 301 and dedication portion 303.

For an embodiment, chunk 301 may comprise one page from a block of memory. A block of memory may comprise a plurality of storage locations, wherein the storage locations individually may contain a byte or more of data. As indicated in an example above, a block of memory may comprise, for an embodiment, 16 kB, and may be organized into 32 pages with 512 bytes per page. Of course, this is merely an example block size and an example organization for the block, and the scope of claimed subject matter is not limited in these respects. Chunk 301, therefore, for this example embodiment, may comprise 512 bytes, although again, the scope of claimed subject matter is not limited in this respect. Dedicated portion 303 may comprise any of a range of sizes, depending on the number of bits required to enable a desired level of error detection and correction. For the present example embodiment, there is a single dedicated portion in the secondary memory associated with chunk 301. As will be seen in the discussion below in connection with FIG. 5, the scope of claimed subject matter is not limited to a single dedicated portion of the secondary memory associated with a chunk of the primary memory.

Figure 4:
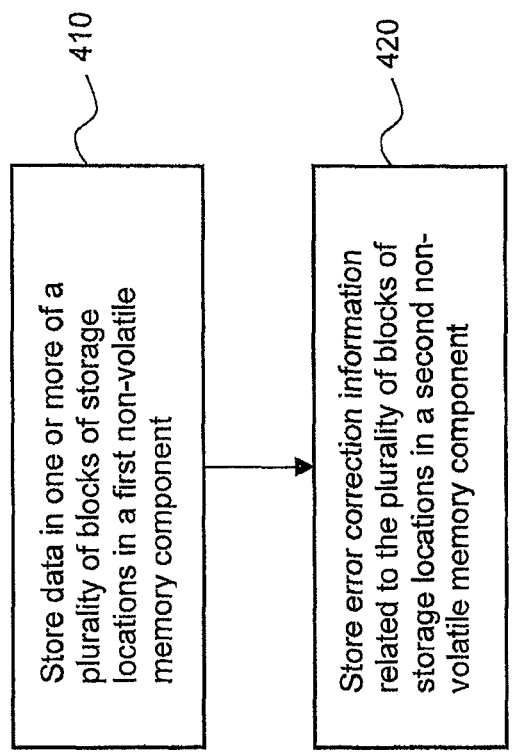
FIG. 4 is a flow diagram of an example embodiment of a method for storing, in a secondary memory, error correction information related to information stored in a primary non-volatile memory.

FIG. 4 is a flow diagram of an example embodiment of a method for storing error correction information. At block 410, data may be stored in one or more of a plurality of blocks of storage locations in a first non-volatile memory component. At block 420, error correction information related to the one or more of the plurality of blocks of storage locations may be stored in a second non-volatile memory component. Embodiments in accordance with claimed subject matter may include all of, more than, or less than blocks 410 and 420. Further, the order of blocks 410 and 420 is merely an example order, and the scope of claimed subject matter is not limited in this respect.

For the example embodiment of FIG. 4, the first non-volatile memory may comprise a NAND Flash memory. The second non-volatile memory for the example may comprise a PCM memory. However, the scope of claimed subject matter is not limited to these particular memory device types. For example, the first non-volatile memory component may comprise a NOR flash memory component for an embodiment. Also, for one or more embodiments, the second memory component may comprise any of a range of device types including, but not limited to, dynamic random access memory (DRAM), Flash NOR, Flash NAND, and PCM Flash, to name but a few examples.

As discussed above, PCM memory has a feature of being able to re-write a single bit of information without first requiring an erase operation. PCM memory further comprises non-volatile memory, wherein data may be retained even in the absence of applied power. The ability to perform write operations without needing to perform erase operations allows for read and write operations that are faster than those for NAND and NOR memories. As also mentioned above, PCM memory may be more reliable than other non-volatile memory types. The increased reliability and performance of PCM memory may make PCM memory a good choice to act as a secondary memory to store error correction information related to a primary memory.

Write operations to a PCM memory may take one of a couple of forms. In an embodiment, in a "program" mode of operation, a bit value of "1" denotes a mask, and the contents of the field for that bit are not changed. A bit value of "0" indicates that the contents of the field for that bit are to be modified. Also for an embodiment, in an "overwrite" mode of operation, all of the bits are considered to carry information to be written.

For one or more embodiments, an additional "program" mode of operation may be implemented. For this additional program mode, a bit value of "0" serves as a mask, and the contents of the field for that bit are not changed. A bit value of "1" indicates that the content of the field of field for that bit are to be modified. For example, if the field has a "0" stored therein, a value of "1" in the incoming data would cause the data in the field to be changed to a "1". For another example, if the field has stored therein a "1", a value of "0" in the incoming data would cause the data field to remain at its current value of "0".

The two "program" modes of operation may be utilized in error detection and correction operations to allow a microcontroller to write partial bytes of data if desired. That is, during a modification of the error correction information stored in the secondary memory, subsets of dedicated portions may be modified with appropriate information without needing to re-program the remaining part of the dedicated portion.

Figure 5:
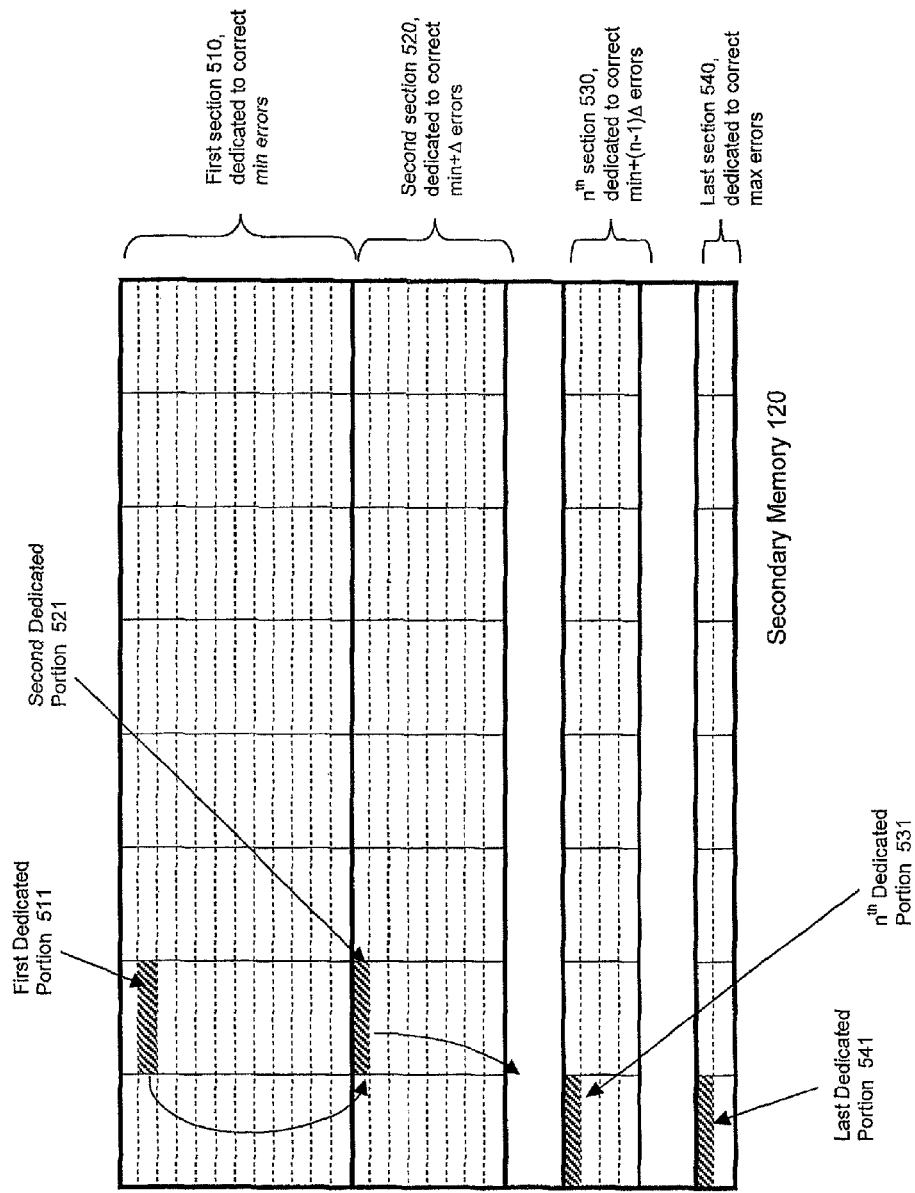
FIG. 5 is a diagram depicting an example embodiment of a secondary memory containing error correction information related to information stored in a primary non-volatile memory.

FIG. 5 is a diagram depicting secondary memory 120 with varying levels of error correction information. A first dedicated portion 511 may be associated with a chunk of a primary memory component, such as chunk 301, discussed above. Rather than the static assignment of dedicated portions of secondary memory 120 described above, another technique may be utilized wherein a varying amount of error correction storage space is dedicated to any particular chunk of primary memory. For one or more embodiments, the error correction capability for a single chunk is increased if an error occurs. By increasing the error correction capability in this manner, it may be possible to read the chunk of data correctly in the event of additional errors.

At the start of error correction activities, the plurality of chunks of primary memory are linked to or otherwise associated with corresponding dedicated portions of secondary memory. For example, chunk 301 may be linked to first dedicated portion 511. First dedicated portion 511 for this example is one of a plurality of dedicated portions located within a first section 510 of secondary memory 120. First section 510 for this example may be sufficient in size to enable detection and/or correction of a specified minimum number of errors (min) in the plurality of chunks of primary memory 510. Similarly, the size of individual dedicated portions, such as portion 511, may be determined according to a minimum number of bits required to protect against a specified minimum number of errors. The total size of first section 510, for the present example, may be determined by multiplying the total number of chunks in primary memory by the number of bits per chunk required to detect and correct the specified number of minimum errors. Note that in selecting the minimum size of first section 510 in this manner, it is ensured that enough secondary memory is set aside so that the specified minimum number of errors may be detected and corrected for all of the chunks of primary memory 110. The remaining portion of secondary memory 120 may be divided to produce a second section 520 and the remainder. Second section 520 for this embodiment may be dedicated to storage of sufficient bits to be able to detect and correct an additional number "Δ" of errors. In other words, for the particular chunk 301 of primary memory 110, the combined number of bits in first dedicated portion 511 and second dedicated portion 521 is sufficient to detect and correct min+Δ errors. Second dedicated portion 521 may be linked to first dedicated portion 511 by way of a pointer, in an embodiment, stored along with error correction information in first dedicated portion 511. In another embodiment, relationships between dedicated portions may be maintained in a table stored elsewhere in either primary memory 110 or secondary memory 120.

If more bits are desired for error detection and correction than can be provided by first section 510 and second section 520, the remaining portion of secondary memory 120 may be divided in a manner similar to that discussed above in connection with second section 520. For example, an $n^{th}$ section 530 may be set apart to provide for the detection and correction of min+(n−1)Δ errors. A last section 540, along with the other dedicated sections of secondary memory 120, is dedicated to the detection and correction of a maximum (max) number of errors. Of course, the maximum number of errors may be bound by the particular error detection and correction algorithm utilized, the size of primary memory 110, and the size of secondary memory 120. For one or more embodiments, and as mentioned above, all of the chunks of primary memory 110 may be associated with a dedicated portion within first section 510 of secondary memory 120. Thus, all of primary memory 110 may be assured of the detection and correction of the specified minimum number of errors. Also, for an embodiment, links or associations to other dedicated portions within sections 520, 530, or 540, for example, may be determined as errors are detected for various chunks of primary memory 110. Thus, for some chunks of primary memory 110, the error detection and correction algorithm may make use of increasing numbers of bits of error correction information for those chunks experiencing greater numbers of errors. For example, if relatively large numbers of errors are found within chunk 301, first dedicated portion 511, second dedicated portion 521, $n^{th}$ dedicated portion 531, and last dedicated portion 541 may all be utilized to store error correction information associated with chunk 301.

As mentioned previously, for one or more embodiments, some chunks of primary memory 110 may have greater error detection and correction capabilities than other chunks, depending on the allotment of dedicated portions within the various levels of sections in secondary memory. As also mentioned previously, it may be desirable to track which chunks have greater than minimum error correction capability and at which address the additional bits of error correction information are stored. For an embodiment, this information may be stored in spare areas of primary memory 110 that might otherwise have been used for error correction information in the absence of a secondary memory.

For another embodiment, the spare areas of primary memory noted above may be utilized to store error correction information sufficient to detect and correct minimum amounts of errors, and the secondary memory may be utilized to store additional error correction information to increase the error detecting and correcting capabilities for associated chunks of primary memory.

In yet another embodiment, the spare areas of primary memory may be utilized as the last dedicated portions for error correction information storage, and the secondary memory may be utilized for the other levels of sections of dedicated portions.

Of course, the above techniques for organizing error detection and correction information storage are merely examples, and the scope of claimed subject matter is not limited in these respects. Also, embodiments in accordance with claimed subject matter are not limited to any particular error detection and/or correction algorithm. Example error correction codes that may be utilized may include, but are not limited to, BCH codes and Reed-Solomon codes, to name but a couple of examples.

Another aspect to increasing the reliability of Flash memory involves "wear leveling." Wear leveling, in general, may comprise a function that allows for uniform usage of the blocks of a memory device. For Flash memory such as NAND memory, wear leveling algorithms may enhance the reliability of the memory and increase the life-span of individual blocks. For one or more embodiments, static and/or dynamic wear-leveling algorithms may be utilized. In the case of dynamic wear leveling, incoming data may be written to free blocks in order to spread the usage of flash blocks uniformly over the whole free flash space, upon the arrival of new fresh data.

For static wear-leveling, all blocks of memory may be involved in leveling operations, including blocks of memory whose data never or rarely changes. Such blocks may have their contents copied to another block so that the original block can be used for more frequently-changing data. Static wear leveling operations may be triggered if the difference between the maximum and the minimum number of write/erase cycles per block reaches a specified threshold. In order to execute static wear-leveling operations, information related to the "ages" of the various blocks of memory may be stored. One embodiment for storing wear-leveling information is discussed below.

FIG. 6 is a block diagram of an information storage system 600 comprising a NAND memory 610 and a PCM memory 620. Also included in system 600 for this example embodiment is a microcontroller 630. Microcontroller 630 may, for this example, perform the wear-leveling operations described herein at least in part by executing instructions stored on secondary PCM memory 620, although the scope of claimed subject matter is not limited in this respect.

As depicted in FIG. 6, NAND memory 610 comprises a plurality of blocks. PCM memory 620 for this example embodiment contains a plurality of storage locations for storing wear-leveling information 625. The blocks of wear-leveling information 625 are associated with the plurality of blocks of NAND memory 610. Wear-leveling information 625 for an embodiment may comprise the number of times a particular block of NAND memory 610 has been erased. Also for an embodiment, if a block is erased, that block's age counter may be incremented. The increment may be made by writing a bit of information to the PCM memory. Note that with PCM memory, there is no need to erase a block before writing to it. By maintaining the wear-leveling information in a secondary memory, such as PCM memory 620, the wear-leveling information is not subject to the long-term reliability issues of the NAND memory, and more space may be available on the primary memory. Further, the use of secondary memory to store wear-leveling information related to the primary memory avoids the situation of needing to store the wear-leveling information in the primary memory, which would result in a loss of primary storage locations and would further result in an increase in overhead. Using the wear-leveling techniques described herein, the mean age of the physical NAND blocks of primary memory 610 may be maintained approximately constant.

For another embodiment, error correction information and wear-leveling information related to a primary flash memory may both be stored on a secondary memory such as, for this example, a PCM memory. For this embodiment, wear-leveling operations may take advantage of the information on failed bits to increase a block's age, thereby extending the useful life of the primary flash memory.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

What is claimed is:

1. A method comprising:
   storing data in at least one block of a plurality of blocks of a first non-volatile memory;
   storing, in a second memory, overhead information related to the at least one block of the plurality of blocks; and
   varying an amount of the second memory storing the overhead information related to the at least one block of the plurality of blocks.

2. The method of claim 1, wherein the overhead information comprises error correction information and varying the amount of the second memory comprises increasing an error correction capability for the at least one block upon an error occurring in accessing the data in the at least one block.

3. The method of claim 1, further comprising determining a size of the amount of the second memory storing the overhead information related to the at least one block, wherein said determining is based on a minimum number of bits to protect against a specified minimum number of errors.

4. The method of claim 1, further comprising dividing the second memory into a first section and a first remainder, the first section being sufficient in size to enable correction of a specified minimum number of errors in the plurality of blocks.

5. The method of claim 4, further comprising dividing the first remainder into a second section and a second remainder, the second section being sufficient in size to enable correction of an additional number of errors in the plurality of blocks.

6. The method of claim 5, wherein varying the amount of the second memory comprises storing bits of the overhead information related to the at least one block of the plurality of blocks in a first portion of the first section of the second memory and storing other bits of the overhead information related to the at least one block of the plurality of blocks in a second portion of the second section of the second memory.

7. The method of claim 6, further comprising linking the first portion of the first section with the second portion of the second section.

8. The method of claim 5, wherein varying the amount of the second memory comprises distributing bits of the overhead information related to the at least one block of the plurality of blocks among a portion of each section of a plurality of sections comprising at least the first section and the second section.

9. The method of claim 8, further comprising selecting the plurality of sections based on a number of errors occurring in accessing the data in the at least one block.

10. The method of claim 1, further comprising tracking which blocks of the plurality of blocks have more than a minimum error correction capability.

11. The method of claim 10, further comprising, for each block of the plurality of blocks having more than the minimum error correction capability, tracking addresses at which bits of the overhead information related to the block are stored.

12. The method of claim 1, further comprising storing information regarding a tracking of which blocks of the plurality of blocks have more than a minimum error correction capability in the first non-volatile memory.

13. The method of claim 1, wherein varying the amount of the second memory comprises storing bits of the overhead information related to the at least one block of the plurality of blocks in the first non-volatile memory and storing other bits of the overhead information related to the at least one block of the plurality of blocks in the second memory.

14. The method of claim 13, wherein the bits stored in the first non-volatile memory are sufficient to correct a specified minimum number of errors and the other bits stored in the second memory are sufficient to correct an additional number of errors.

15. An apparatus comprising:
a first non-volatile memory component comprising a plurality of blocks configured to store data; and
a second memory component configured to store overhead information related to the plurality of blocks storing the data, wherein a varying amount of the second memory component is dedicated to storing overhead information related to each block of the plurality of blocks.

16. The apparatus of claim 15, wherein the second memory component comprises a plurality of sections, wherein a first section of the plurality of sections is sufficient in size to enable correction of a specified minimum number of errors in the plurality of blocks and a second section of the plurality of sections is sufficient in size to enable correction of a first additional number of errors in the plurality of blocks.

17. The apparatus of claim 16, wherein the plurality of sections is sufficient in size to enable correction of a specified maximum number of errors in the plurality of blocks.

18. The apparatus of claim 15, wherein the overhead information comprises error correction information, wear-leveling information, or both.

19. The apparatus of claim 15, wherein the first non-volatile memory component comprises a flash memory component.

20. The apparatus of claim 19, wherein the second memory component is selected from the group consisting of: dynamic random access memory (DRAM), flash NOR, flash NAND, and phase-change memory (PCM) flash.

21. The apparatus of claim 15, further comprising a microcontroller coupled to the first memory component and to the second memory component.

22. The apparatus of claim 21, wherein the microcontroller is configured to perform wear-leveling operations using information stored in the second memory component.

23. A system comprising:
a computer processor; and
a memory device operationally coupled to the computer processor, the memory device comprising:
a first non-volatile memory component comprising a plurality of blocks configured to store data; and
a second memory component configured to store overhead information related to the plurality of blocks storing the data, wherein a varying amount of the second memory component is dedicated to storing overhead information related to each block of the plurality of blocks.

* * * * *